United States Patent [19]

Nakayama et al.

[11] Patent Number: 5,200,277
[45] Date of Patent: Apr. 6, 1993

[54] ELECTROLUMINESCENT DEVICE

[75] Inventors: Takahiro Nakayama; Kenichi Onisawa; Katsumi Tamura, all of Ibaraki; Kazuo Taguchi, Tokyo; Akira Sato, Ibaraki; Kenichi Hashimoto, Ibaraki; Yoshio Abe, Ibaraki; Masanobu Hanazono, Ibaraki, all of Japan

[73] Assignee: Hitachi, Ltd., Tokyo, Japan

[21] Appl. No.: 454,961

[22] Filed: Dec. 22, 1989

Related U.S. Application Data

[63] Continuation-in-part of Ser. No. 309,860, Feb. 14, 1989, abandoned.

[30] Foreign Application Priority Data

Feb. 29, 1988 [JP] Japan ................. 63-47140

[51] Int. Cl.$^5$ .............. B32B 5/14; C23C 14/00; B05D 1/02
[52] U.S. Cl. ................. 428/690; 428/917; 428/216; 428/336; 428/699; 428/698; 428/701; 313/506; 313/509; 204/192.22; 204/192.23; 427/66
[58] Field of Search ............ 313/503, 506, 509, 498; 428/690, 917, 216, 336, 699, 698, 701; 427/66 M; 204/192.23, 192.22

[56] References Cited

U.S. PATENT DOCUMENTS 4,670,355  6/1987  Matsudaira ................. 428/690

OTHER PUBLICATIONS

S. Kinoshita, et al, vol. J69-C, No. 4, p. 416 (1986).
H. Morisaki et al, vol. 5, No. 4 Jul./Aug. 1987 p. 1767.

Primary Examiner—Ellis P. Robinson
Assistant Examiner—Charles R. Nold
Attorney, Agent, or Firm—Antonelli, Terry, Stout & Kraus

[57] ABSTRACT

An electroluminescent device including dielectric films each of which consists of first regions made of a material with a strong self-healing type dielectric breakdown characteristic, second regions made of a material with a strong propagating type dielectric breakdown characteristic, and mixed regions consisting of a mixture of these two materials, the first and second regions being arranged alternately in the film thickness direction with the mixed regions therebetween, the mixing ratio of these two materials in the mixed regions changing in such a manner that the ratio of one material gradually decreases from a region of this material toward the adjacent region of the other material, that is, the ratio of the other material increases. Thus, the changes in the mixing ratio of these two materials of the dielectric films in the film thickness direction are continuous and periodic. These dielectric films, with a high breakdown field strength, make it possible to obtain an electroluminescent device having a large drive voltage margin and providing a luminescence of high brightness.

11 Claims, 8 Drawing Sheets

ELECTROLUMINESCENT DEVICE

This application is a continuation-in-part of application Ser. No. 07/309,860; filed Feb. 14, 1989, now abandoned.

BACKGROUND OF THE INVENTION

1. Field of the Invention

This invention relates to an electroluminescent device.

2. Description of the Prior Art

An electroluminescent device (hereinafter referred to as "EL device") comprises an electroluminescent layer or an active layer (hereinafter referred to as "active layer") sandwiched between a pair of dielectric films, the three layers being further sandwiched between a pair of electrodes at least one of which is transparent. The active layer is caused to emit light by applying AC voltage thereto. To drive this device, a high voltage is required.

The active layer of an EL device is made of ZnS with Mn added to act as luminescent centers and is formed by vacuum evaporation in a thickness of 500 nm to 700 nm. As for the dielectric films, they are made of a material such as $Y_2O_3$, $SiO_2$, $Al_2O_5$ or $Ta_2O_5$ and are formed by sputtering or the like in a thickness of 400 nm to 800 nm. The transparent electrode is made of indium tin oxide and is formed on a glass substrate, whereas the oppositely placed electrode is made of aluminum. A high voltage of AC 200V to 400V is applied to the active layer through the dielectric films to emit luminescent light.

In view of the above, it is desirable that the dielectric films exhibit a high dielectric constant and a high dielectric breakdown strength. A conventional dielectric film (Japanese Patent Laid-Open Publication No. 52-129296) is composed of a pair of layers deposited together: the material of one of the layers exhibits a high dielectric constant (which means it generally exhibits a high breakdown field strength) and the material of the other layer exhibits a high breakdown field strength (which means it generally exhibits a low dielectric constant). Another conventional dielectric film (Japanese Patent Laid-Open Publication No. 59-224098) is prepared by evenly mixing these two materials, having opposite properties, with each other before forming them into layers.

The problem with conventional film structures is that no consideration is given in them to structurally utilizing the difference in dielectric breakdown characteristics between the above-mentioned materials, which means they are inadequate from the viewpoint of enhancing the dielectric breakdown field strength of an EL device.

SUMMARY OF THE INVENTION

It is accordingly an object of this invention to provide an EL device which provides a luminescence of high brightness and which exhibits a higher dielectric breakdown strength because of its improved dielectric film structure.

In order to attain the above object, this invention proposes an electroluminescent device comprising: a substrate; first electrodes formed on the substrate; a first dielectric film formed on the first electrodes: and active layer formed on the first dielectric film; a second dielectric film formed on the active layer; and second electrodes formed on the second dielectric film; the above-mentioned first and second dielectric films including first regions made of a material with a strong self-healing type dielectric breakdown characteristic, second regions made of a material with a strong propagating type dielectric breakdown characteristic, and mixed regions made of a material consisting of a mixture of these two materials, the above first and second regions being deposited alternately with the above-mentioned mixed regions therebetween. The mixing ratio of these two materials in the above-mentioned mixed regions changes in such a manner that the ratio of one material gradually decreases from a region thereof toward the adjacent region of the other material (that is, the ratio of the other material increases), the changes in the mixing ratio of these two materials of the dielectric films in the film thickness direction being thus continuous and periodic.

The term "propagating type dielectric breakdown characteristic" refers to a material the nature of which allows dielectric breakdown locally generated in a part of a device as a result of applying voltage thereto to be propagated to other parts of the device, with the result that the device no longer functions- In contrast, when a material is said to have a "self-healing type dielectric breakdown characteristic", it means that the material does not allow dielectric breakdown locally generated in a part of a device by applying voltage thereto to be propagated beyond that part, thus the device continues to function except in the breakdown portion.

The material having a strong self-healing type dielectric breakdown characteristic may be one of the following materials: $SiO_2$, $Si_3N_4$ and $Ta_2O_5$; and the material having a strong propagating type dielectric breakdown characteristic may be one of the following materials: $Y_2O_3$, $Sm_2O_3$, $TiO_2$, $HfO_2$, $Al_2O_3$, $ZrO_2$, $X-TaO_3$, $X-NbO_3$ and $X-TiO_3$, where X represents a metal selected from among the following metals: Sr, Ba, Pb, Sn, Mg, Zn and Cd.

This invention further proposes an EL device in which the formation period in the film thickness direction of the regions made of one of the two materials constituting a dielectric film is in the range of 0.5 nm to 30 nm.

In accordance with this invention, there is further provided a method of manufacturing electroluminescent devices, comprising the steps of: forming first electrodes on a substrate; forming a first dielectric film by depositing alternately on the first electrodes regions of a material with a strong self-healing type dielectric breakdown characteristic and regions of a material with a strong propagating type dielectric breakdown characteristic, some of the particles of one material in one regions sinking into the other regions formed previously; forming an active layer on the first dielectric film; forming a second dielectric film on the active layer in the same manner as in forming the abovementioned first dielectric film; and forming second electrodes on the second dielectric film.

The structure of the EL device of this invention is based on the following concept: generally speaking, a dielectric material having a high dielectric constant tends to exhibit a propagating type dielectric breakdown characteristic even under a relatively low voltage, whereas a dielectric material having a low dielectric constant tends to exhibit a self-healing type dielectric breakdown characteristic even under a relatively high voltage. Suppose a dielectric film is made of two materials A and B, material A having a high dielectric constant and exhibiting a strong propagating type dielectric breakdown characteristic and material B having a low dielectric constant and exhibiting a strong self-healing type dielectric breakdown characteristic. The breakdown mode of the entire dielectric film can be modified to a self-healing type by placing a relatively thin layer containing a lot of material A between layers containing a lot of material B and repeating this until a required film thickness is reached. This results in the mixing ratio of the materials A and B changing periodically and continuously. This arrangement helps to heighten the dielectric breakdown field strength of an EL device.

So far, dielectric materials have been discussed as if they are only associated with either of the two extremes: the propagating type dielectric breakdown characteristic and the self-healing type dielectric breakdown characteristic. In reality, however, dielectric breakdown in a dielectric material exhibits a tendency toward self-healing type dielectric breakdown under a relatively low voltage and a tendency toward propagating type dielectric breakdown under a relatively high voltage. Since the dielectric breakdown field strength of a material is determined by the voltage level causing propagation type dielectric breakdown in it, it is not always correct to classify materials into these two categories of characteristics. In some cases, the tendency in a material toward self-healing type dielectric breakdown is recognized as such only in comparison with some other material.

In accordance with this invention, pieces of a material which has a high dielectric constant and which has not been conventionally employed because of its excessively low dielectric breakdown field strength are placed between pieces of a material having a high dielectric breakdown field strength and are deposited together to form a film structure which allows the characteristics of both materials to be fully utilized, thereby substantially enhancing the performance of an EL device.

The objects, advantages and novel features of this invention will now be described in detail with reference to the accompanying drawings.

BRIEF DESCRIPTION OF THE DRAWINGS

FIG. 4 is a schematic view of an apparatus for forming dielectric films in accordance with this invention;

DETAILED DESCRIPTION OF THE INVENTION

Figure 1:
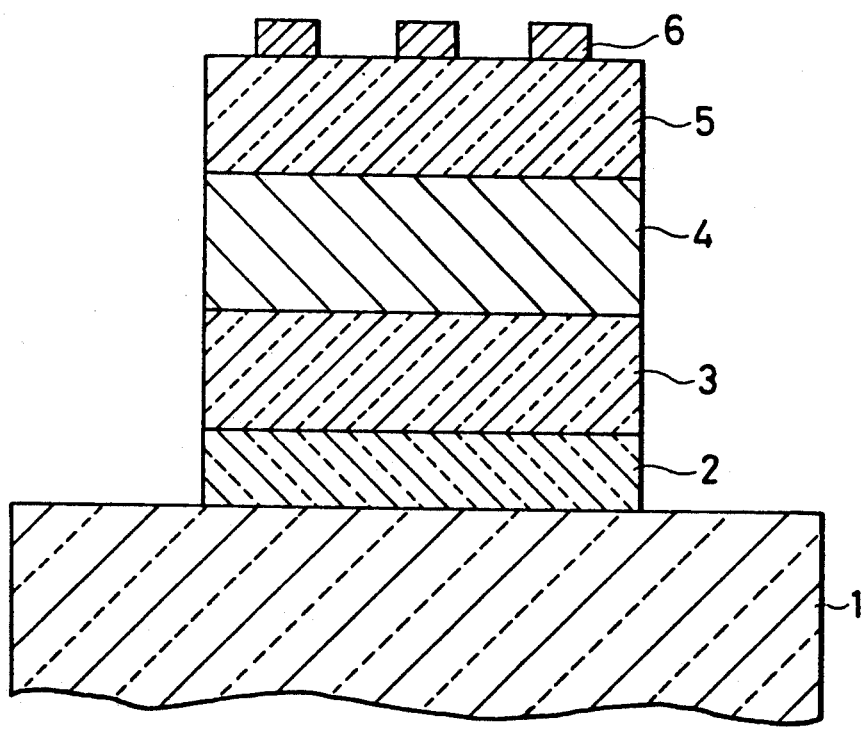
FIG. 1 is a sectional view of an EL device in accordance with this invention.

FIG. 1 is a sectional view showing the structure of an embodiment of the EL device of this invention. A plurality of transparent first electrodes 2 (with a thickness of 200 nm), spaced from each other, are provided on a glass substrate 1. A plurality of opposite or second electrodes 6 (with a thickness of 200 nm), likewise spaced from each other, are arranged at right angles to the first electrodes 2. Provided between the first electrodes 2 and the second electrodes 6 is an active layer 4 which is sandwiched between the dielectric films. This active layer contains ZnS and 0.5 w % of Mn and has a thickness of 500 nm. The dielectric films mentioned above consist of a first dielectric film 3 (with a thickness of 500 nm) arranged between the first electrodes 2 and the active layer 4 and a second dielectric film 5 arranged between the active layer 4 and the second electrodes 6.

Figure 2:
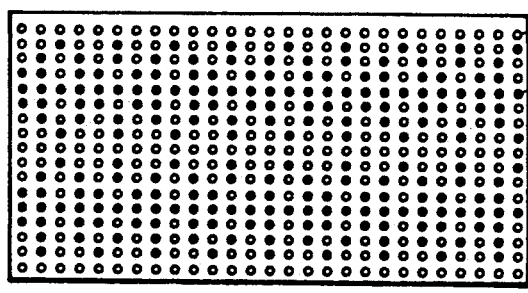
FIG. 2 is a conceptual view showing the distribution of the two materials constituting a dielectric film in accordance with this invention.
Figure 3:
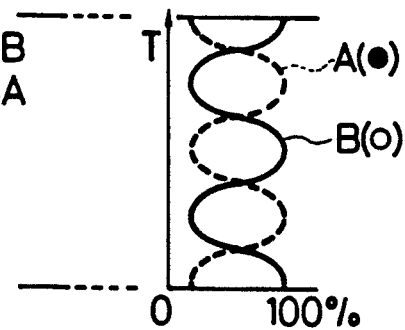
FIG. 3 shows the continuous, periodical changes in the mixing ratio of the two materials constituting the film of FIG. 2.

Illustrated in FIGS. 2 and 3 is the structural concept of the dielectric films of an EL device in accordance with this invention. FIG. 2 is a side sectional view of a film in accordance with this invention. The black spots represent material A, and the white spots represent material B. As shown in FIG. 3, the mixing ratio of the two materials changes alternately, periodically and continuously in the film thickness direction, thusly: a 100% B region, B/A mixture region, 100% A region, A/B mixture region and 100% B region.

Next, an apparatus for forming such a dielectric film will be described with reference to FIG. 4. The formation of a dielectric film is effected by radio-frequency sputtering (hereinafter referred to as RF sputtering). A substrate holder 12 in a sputtering chamber 11 rotates, with a substrate on which a dielectric film is to be formed mounted thereon, at a speed of 40 rpm. A target holder 13 for material A, e.g., $TiO_2$, and a target holder 14 for material B, e.g., $SiO_2$, are arranged face to face with the substrate holder 12. A voltage controlled by a controller 18 is applied to the target holders 13 and 14 from radio-frequency power sources 16 and 17, alternately or simultaneously. The material particles emitted from a target in this process form a deposit layer on the substrate. The sputtering chamber 11 is sufficiently evacuated by means of a vacuum device 15. An Ar gas containing 4% $O_2$ is supplied to the chamber through a supply valve 19, keeping the chamber pressure at 1.3Pa. The temperature of the substrate is kept at 40° C. by water cooling. The power to be applied to the $TiO_2$ target and the $SiO_2$ target is adjusted to $2.6W/cm^2$ and $3.9W/cm^2$, respectively. The deposition rates for $TiO_2$ and $SiO_2$ are set to 1.1 nm/min and 5.5 nm/min, respectively, thus in a ratio of approximately 1:3.

Figure 5:
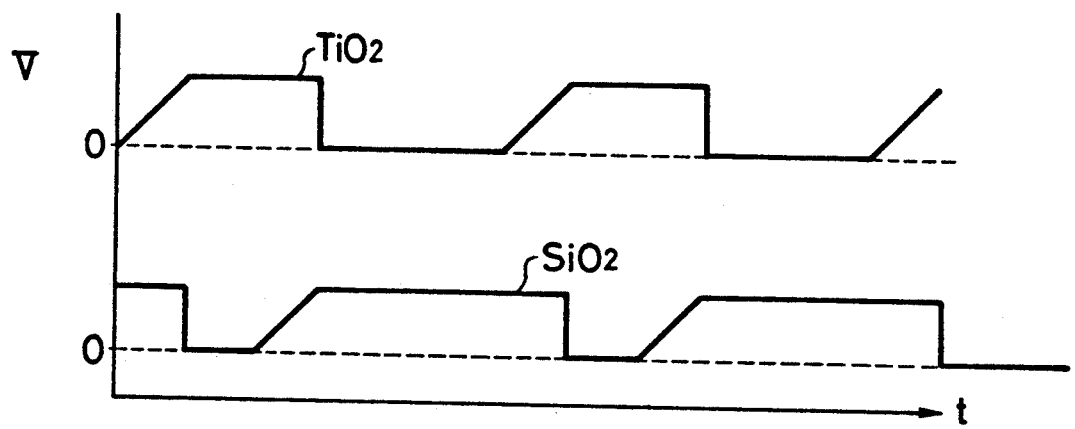
FIGS. 5 and 6 are diagrams illustrating the changes in the voltage applied to the targets when preparing a dielectric film by means of the apparatus of FIG. 4.
Figure 7:
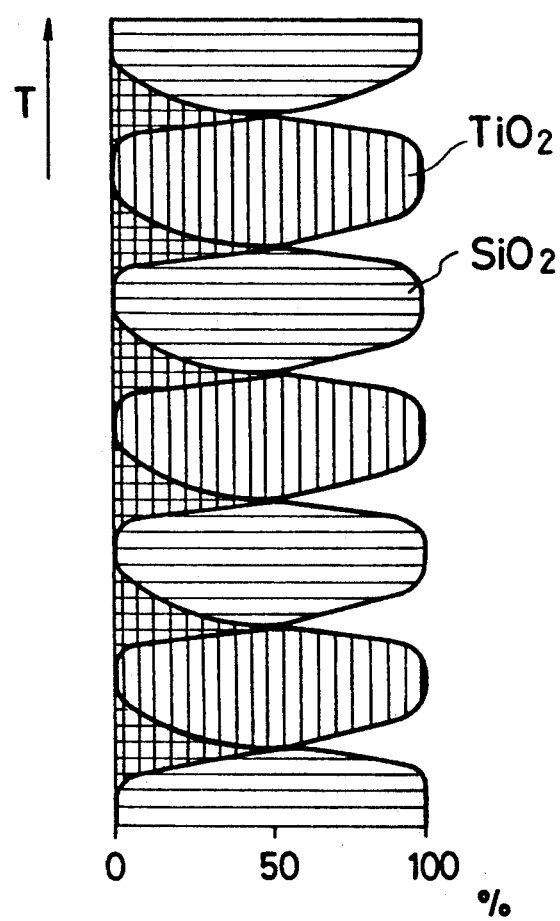
FIG. 7 is a diagram showing the continuous, periodical changes in the mixing ratio of the two materials in the thickness direction T of a dielectric film formed by applying a voltage which is changed as shown in FIG. 5.

As shown in FIG. 5, the voltage applied to the $TiO_2$ target is gradually raised, and, when it reaches a predetermined level, the voltage supply to the $SiO_2$ target is cut off. By repeating this process, the mixing ratio of $SiO_2$ and $TiO_2$ can be changed continuously and periodically in the film thickness direction as shown in FIG. 7, thusly:

100% $SiO_2$ and 0% $TiO_2 \rightarrow$ 50% $SiO_2$ and 50% $TiO_2 \rightarrow$

0% $SiO_2$ and 100% $TiO_2 \rightarrow$ 50% $SiO_2$ and 50% $TiO_2 \rightarrow$

100% $SiO_2$ and 0% $TiO_2$

In RF sputtering, particles emitted from a target can sink into the previously formed region, so that, if $TiO_2$ and $SiO_2$ are sputtered alternately, a mixture region of $TiO_2$ and $SiO_2$ with a thickness of about 1 nm is formed between, for example, a 1 nm $TiO_2$ region and a 3 nm $SiO_2$ region, thus making the change in the mixing ratio of $TiO_2$ and $SiO_2$ in the film thickness direction continuous and periodical.

Figure 6:
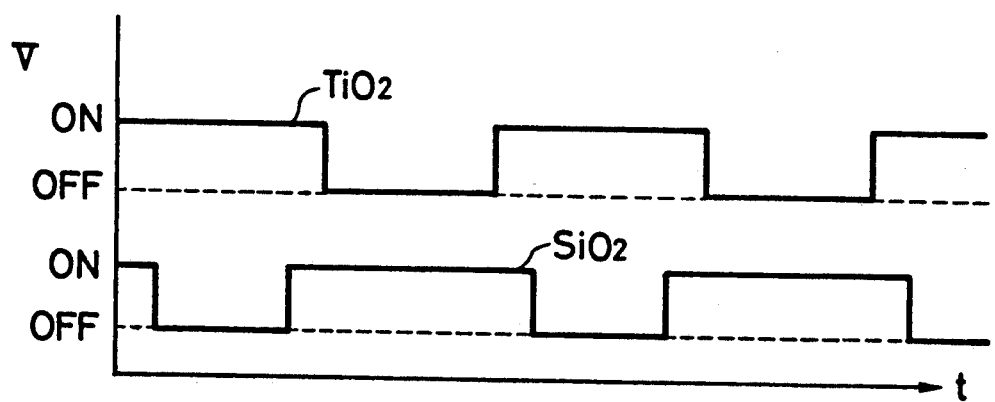

As shown in FIG. 6, a voltage may be applied to the $SiO_2$ target before cutting the voltage supply off to the $TiO_2$ target, thereby forming a mixed region of $TiO_2$ and $SiO_2$ between the $TiO_2$ region and the $SiO_2$ region and controlling the thickness of the mixed region.

In the case of a film structure in which the mixing ratio of materials A and B changes continuously and periodically, its profile can be observed with a transmission-type electron microscope. Where the thickness of each section is 5 nm or more, its profile can be ascertained by secondary ion mass analysis.

It is not necessary for the period of the mixing-ratio changes to be constant in the film thickness direction. A better property may be obtained by varying the period depending on the use, the material, the film deposition characteristic, etc.

Figure 8:
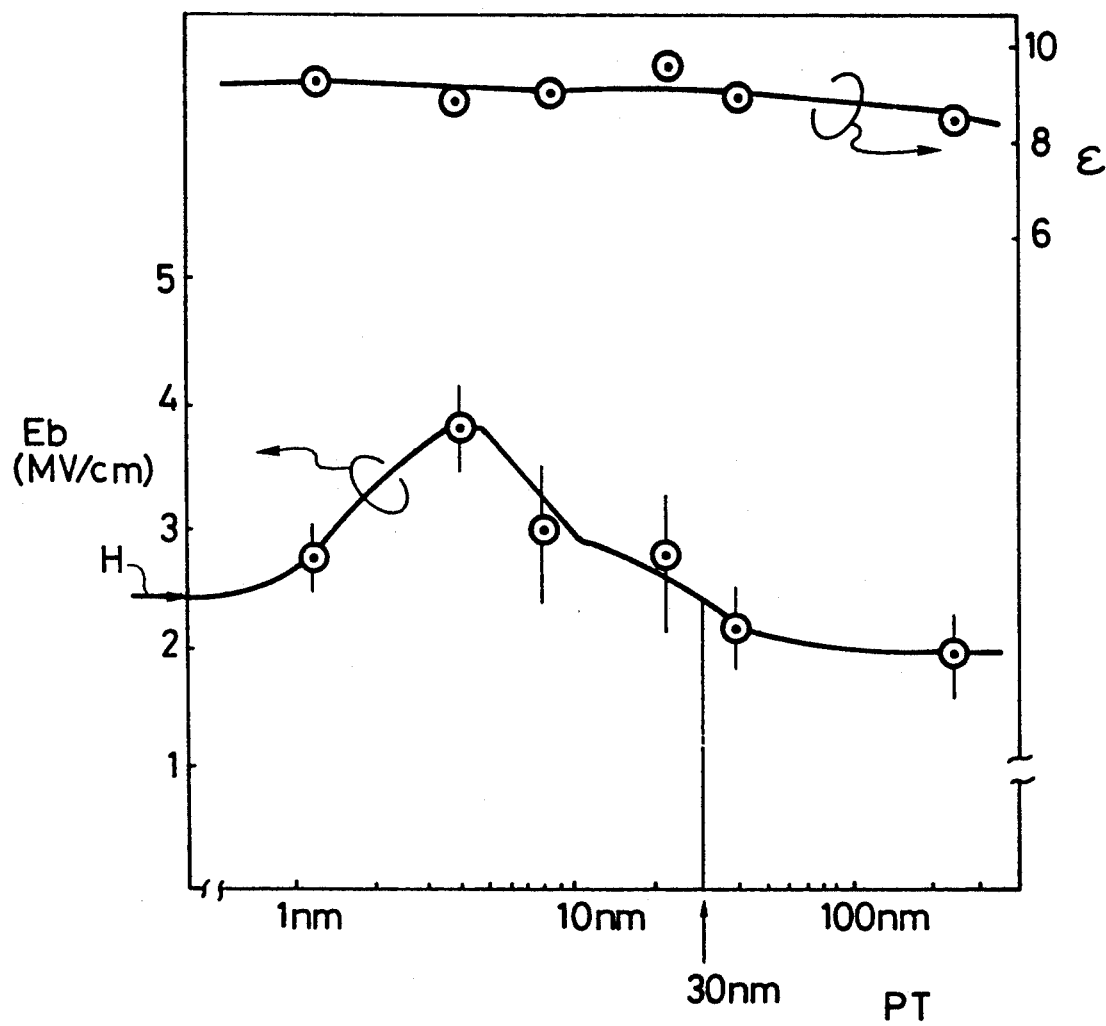
FIG. 8 is a diagram showing the dielectric constant $\epsilon$ and the dielectric breakdown field strength Eb with respect to the thickness PT under periodical changes in the mixing ratio of the two materials of a dielectric film in accordance with this invention.

Six dielectric-film specimens were prepared by means of the above-described apparatus. The respective thicknesses of the $SiO_2$ and $TiO_2$ regions, deposited periodically and continuously, were different from specimen to specimen, thusly: 0.9 nm and 0.3 nm, 3 nm and 1 nm, 6 nm and 2 nm, 15 nm and 5 nm, 30 nm and 10 nm, and 180 nm and 60 nm. The total film thickness was 500 nm in each of the specimens. Plotted in the graph of FIG. 8 are the respective dielectric constants $\epsilon$ and breakdown field strengths Eb of these specimens. As indicated in the graph, an improvement in the breakdown field strength is attained in the range where the periodic thickness is 10 nm or less. Any breakdown field strength value attained in this range of periodic thickness is larger than that of a uniform mixture film prepared by using a mixture target consisting of $TiO_2$- 75% $SiO_2$ (the value indicated by an arrow H on the left-hand side of the vertical axis of FIG. 8). Thus, in the range where the period of the mixing-ratio changes is 30 nm or less, the breakdown field strength value of a dielectric film in accordance with this invention is larger than that of a uniform mixture film.

Figure 9:
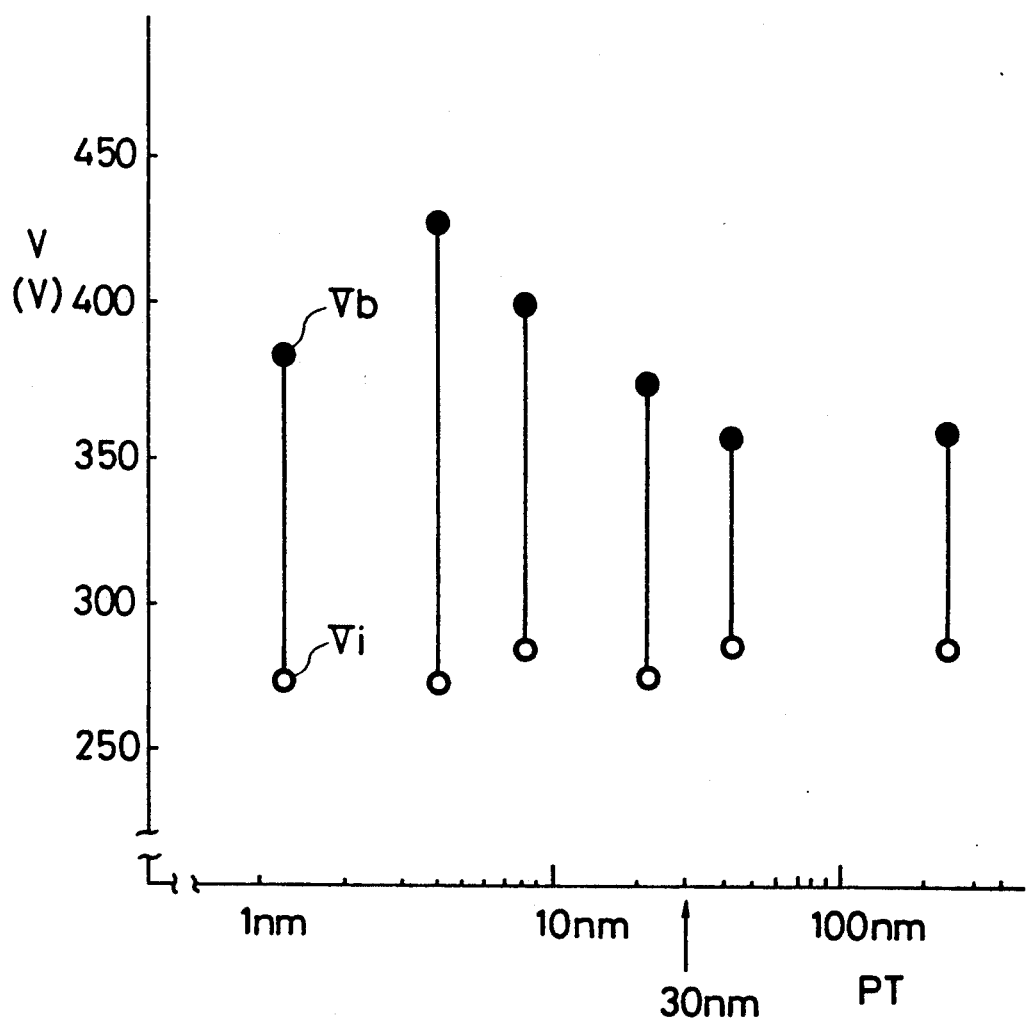
FIG. 9 is a diagram showing the triggering voltage Vi and the breakdown voltage Vb with respect to the thickness PT under periodical changes in the mixing ratio of the materials of the dielectric films of an EL device in accordance with this invention.

Plotted in FIG. 9 are the respective light-emission triggering voltages Vi and device breakdown voltages Vb when the above six specimens were used as the first and second dielectric films of the EL device shown in FIG. 1 under 1 kHz sine-wave voltage. The black spots represent the light-emission triggering voltages Vi and the white spots represent the device breakdown voltages Vb, the difference between these two categories of voltage indicating the drive voltage margin. The larger the drive voltage margin, the more stable is the manner in which the EL device is driven. As shown in FIG. 9, the drive voltage margin is relatively large in the range where the period of the mixing-ratio change is 30 nm or less, so that an improvement in the drive stability of the EL device can be expected in this range.

A deposition apparatus having at least two particle generation sources will suffice for preparing dielectric films in accordance with this invention. Instead of the sputtering technique, which is employed in the above-described embodiment, vacuum evaporation, molecular beam epitaxy (MBE) or chemical vapor deposition (CVD) can also be adopted.

Figure 10:
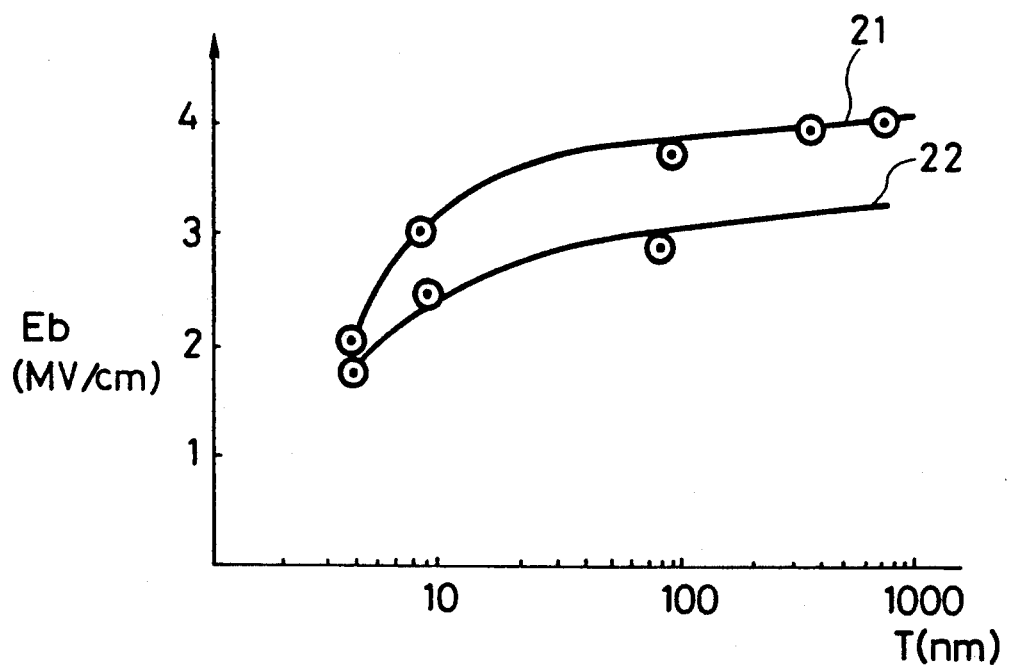
FIG. 10 is a graph in which the breakdown field strength Eb of a dielectric film in accordance with this invention is compared with that of a conventional mixture dielectric film.
Figure 10:
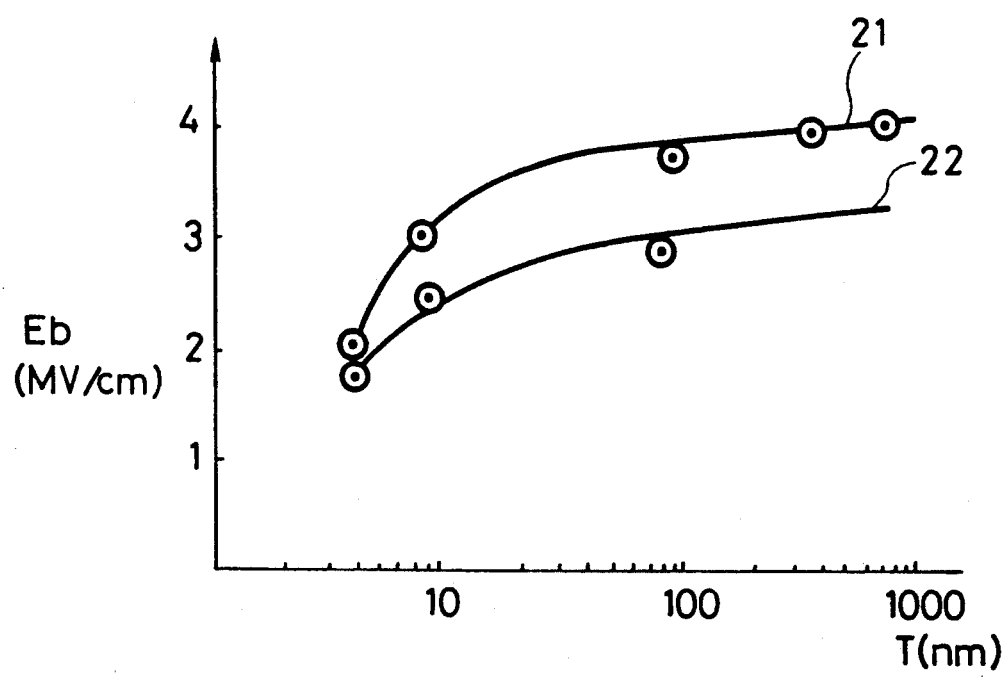

FIG. 10 shows substantial effects attained with a dielectric film in accordance with this invention. Curve 21 represents the relationship between the breakdown field strength Eb and the total film thickness T of a dielectric film of this invention prepared by sputtering ($TiO_2$ 1 nm-$SiO_2$ 3 nm), and curve 22 represents the relationship between the breakdown field strength Eb and the total film thickness T of a uniform mixture dielectric film prepared by sputtering ($TiO_2:SiO_2=1:3$). As indicated by these two curves, the dielectric film of this invention exhibits a breakdown field strength about 25% higher than that of the uniform mixture film in the range beyond two periods. Thus, the EL device of this invention, having a large drive voltage margin, provides a luminescence of high brightness.

What is claimed is:

1. An electroluminescent device comprising: a substrate: first electrodes formed on said substrate; a first dielectric film formed on said first electrodes; an active layer formed on said first dielectric film; a second dielectric film formed on said active layer; and second electrodes formed on said second dielectric film; said first and second dielectric films including first regions made of a material with a strong self-healing type dielectric breakdown characteristic, second regions made of a material with a strong propagating type dielectric breakdown characteristic, and mixed region consisting of a mixture of these two materials, said first and second regions being arranged alternately in the film thickness direction with said mixed regions therebetween, the mixing ratio of these two materials in said mixed regions changing in such a manner that the ratio of one material gradually decreases from a region of this material toward the adjacent region of the other material, the changes in the mixing ratio of these two materials of the dielectric films in the film thickness direction being thus continuous and periodic.

2. An electroluminescent device according to claim 1, wherein said material with a strong self-healing type breakdown characteristic is one selected from the group consisting of $SiO_2$, $Si_3N_4$ and $Ta_2O_5$.

3. An electroluminescent device according to claim 2, wherein said material with a strong propagating type dielectric breakdown characteristic is one selected from the group consisting of $Y_2O_3$, $Sm_2O_3$, $TiO_2$, $HfO_2$, $Al_2O_3$, $ZrO_2$, X-$TaO_3$, X-$NbO_3$ and X-$TiO_3$, where X represents a metal selected from the group consisting of Sr, Ba, Pb, Sn, Mg, Zn and Cd.

4. An electroluminescent device according to claim 1, wherein the deposition period in the film thickness direction of said regions made of any one of the two materials forming said dielectric films being in the range of 0.5 nm to 30 nm.

5. A method of manufacturing electroluminescent devices, comprising the steps of: forming first electrodes on a substrate; forming a first dielectric film by depositing alternately on said first electrodes first regions made of a material with a strong self-healing type dielectric breakdown characteristic and second regions made of a material with a strong propagating type dielectric breakdown characteristic, some of the particles of one material in one of the first and second regions sinking into an adjacent, previously formed region, which is made of the other material to provide a mixed region therebetween, the mixing ratio of these two materials in said mixed regions changing in such a manner that the ratio of one material gradually decreases from a region of this material toward the adjacent region of the other material, the changes in the mixing ratio of these two materials of the dielectric films in the film thickness direction being thus continuous and periodic; forming an active layer on said dielectric film; forming a second dielectric film in the same manner as in the case of said first dielectric film; and forming second electrodes on said second dielectric film.

6. A method according to claim 5, wherein radio-frequency sputtering is applied for the steps of forming said dielectric films.

7. A method according to claim 5, wherein vacuum evaporation is applied for the steps of forming said dielectric films.

8. A method according to claim 5, wherein molecular beam epitaxy is applied for the steps of forming said dielectric films.

9. A method according to claim 5, wherein chemical vapor deposition is applied for the steps of forming said dielectric films.

10. An electroluminescent device comprising: a transparent, electrically insulating substrate; first electrodes formed on said substrate; a first transparent dielectric film formed on said first electrodes; an active layer formed on said first transparent dielectric film and adapted to generate electroluminescence when voltage is applied thereto; a second transparent dielectric film formed on said active layer, and second electrodes formed on said second transparent dielectric film; voltage being applied to said active layer from said first and second electrodes arranged face to face with each other, at least one of said first and second electrodes being transparent, said first and second dielectric films being formed by alternately arranging in the film thickness direction regions containing $SiO_2$ and having a thickness of about 3 nm and regions containing $TiO_2$ and having a thickness of about 1 nm, with mixed regions consisting of a mixture of $SiO_2$ and $TiO_2$ and having a thickness of about 1 nm being arranged therebetween, the mixing ratio of $SiO_2$ and $TiO_2$ of said mixed regions being such that $TiO_2$ increases from a $SiO_2$ region toward a $TiO_2$ region, the changes in the film thickness direction of the mixing ratio of these materials in said dielectric films being thus continuous and periodic.

11. A method of manufacturing electroluminescent devices, comprising the steps of: forming first electrodes on a substrate; alternately providing on an above said first electrodes $SiO_2$ and $TiO_2$ regions by radio-frequency sputtering at deposition rates of 5.5 nm/min and 1.1 nm/min respectively, some of the particles of one material in one of the $SiO_2$ and $TiO_2$ regions sinking into an adjacent region of the other material formed previously to provide a mixed region therebetween, the mixing ratio of these two materials in said mixed regions changing in such a manner that the ratio of one material gradually decreases from a region of this material towards the adjacent region of the other material, the changes in the mixing ratio of these two materials of the dielectric films in the film thickness direction being thus continuous and periodic, thus forming a first dielectric film; providing an active layer on said first dielectric film forming a second dielectric film on said active layer in the same manner as informing said first dielectric film; and forming second electrodes on said second dielectric film.

* * * * *